United States Patent
Yen et al.

(10) Patent No.: US 8,399,961 B2
(45) Date of Patent: Mar. 19, 2013

(54) TUNING THE EFFICIENCY IN THE TRANSMISSION OF RADIO-FREQUENCY SIGNALS USING MICRO-BUMPS

(75) Inventors: Hsiao-Tsung Yen, Tainan (TW); Yu-Ling Lin, Taipei (TW); Cheng Hung Lee, Hsin-Chu (TW); Chin-Wei Kuo, Zhubei (TW); Ho-Hsiang Chen, Hsin-Chu (TW); Min-Chie Jeng, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 185 days.

(21) Appl. No.: 12/974,896

(22) Filed: Dec. 21, 2010

(65) Prior Publication Data

US 2012/0153433 A1    Jun. 21, 2012

(51) Int. Cl.
  *H01L 27/08*   (2006.01)
(52) U.S. Cl. .......................................... 257/531; 361/56
(58) Field of Classification Search .................. 257/531; 361/56, 111
See application file for complete search history.

(56) References Cited

U.S. PATENT DOCUMENTS

| 7,751,164 | B1 | 7/2010 | Jin et al. |
| 7,989,954 | B2 * | 8/2011 | Lin et al. ........................ 257/758 |
| 2012/0039004 | A1 * | 2/2012 | Artieri ............................ 361/56 |

OTHER PUBLICATIONS

Wang et al., "A Review on RF ESD Protection Design," IEEE Transactions on Electron Devices, vol. 52, No. 7, Jul. 2005 (pp. 1304-1311).
Xie et al., "A New Low-Parasitic Polysilicon SCR ESD Protection Structure for RF ICs," IEEE Electron Device Letters, vol. 26, No. 2, Feb. 2005 (pp. 121-123).

* cited by examiner

*Primary Examiner* — Jenny L Wagner
(74) *Attorney, Agent, or Firm* — Slater & Matsil, L.L.P.

(57) ABSTRACT

A device includes a die including a main circuit and a first pad coupled to the main circuit. A work piece including a second pad is bonded to the die. A first plurality of micro-bumps is electrically coupled in series between the first and the second pads. Each of the plurality of micro-bumps includes a first end joining the die and a second end joining the work piece. A micro-bump is bonded to the die and the work piece. The second pad is electrically coupled to the micro-bump.

14 Claims, 6 Drawing Sheets

TUNING THE EFFICIENCY IN THE TRANSMISSION OF RADIO-FREQUENCY SIGNALS USING MICRO-BUMPS

BACKGROUND

Electrostatic discharge (ESD) is a known problem in the manufacturing and the using of integrated circuits (IC). Typically, transistors have thin oxides and insulating layers that can be damaged by the electrostatic discharge, and special care is required to protect the integrated circuits from the damage caused by the ESD. The corresponding circuits are known as ESD protection circuits.

ESD protection circuits, which form part of the IC, are normally connected to the input pads of the IC. ESD protection circuits may also be used at the outputs of the IC. The ESD protection circuits begin conducting or undergo breakdown to provide an electrical path to electrical ground (or to a power-supply rail) when ESD transient occurs and resulting in a very high ESD voltage.

Conventional ESD protection circuits usually have a large parasitic capacitance ($C_{ESD}$) that sometimes degrades the performance of the devices within the IC. For example, the ESD protection circuits typically use large MOS transistors, which have high capacitance values. An ESD protection transistor that is used in conventional ESD protection circuits has an enlarged drain area. Typically the drain extension is at least 2-3 times the minimum drain width that is permitted by the foundry process that is used. Drain extensions that are 10-15 times the minimum drain width have also been used. Typical values for $C_{ESD}$ using this approach are 1.5 pF for a 3 kV rating. When the respective circuits are operated at high frequencies, the large parasitic capacitance of the ESD protection circuits significantly degrades the performance of the respective circuits, which may be for example, wireless transceivers operated at radio-frequencies.

The increased capacitance $C_{ESD}$ also increases the noise that is contributed by the ESD protection circuits. As parasitic capacitance $C_{ESD}$ increases, the noise coupling from the ESD protection circuit to the transceiver increases, which adversely impacts the operation of the transceiver. For example, the increased noise is amplified by the low noise amplifier in wireless transceivers.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel package structure adopting micro-bumps as a part of a filter is provided in accordance with an embodiment. The variations and the operation of the embodiment are discussed. Throughout the various views and illustrative embodiments, like reference numbers are used to designate like elements.

Figure 1:
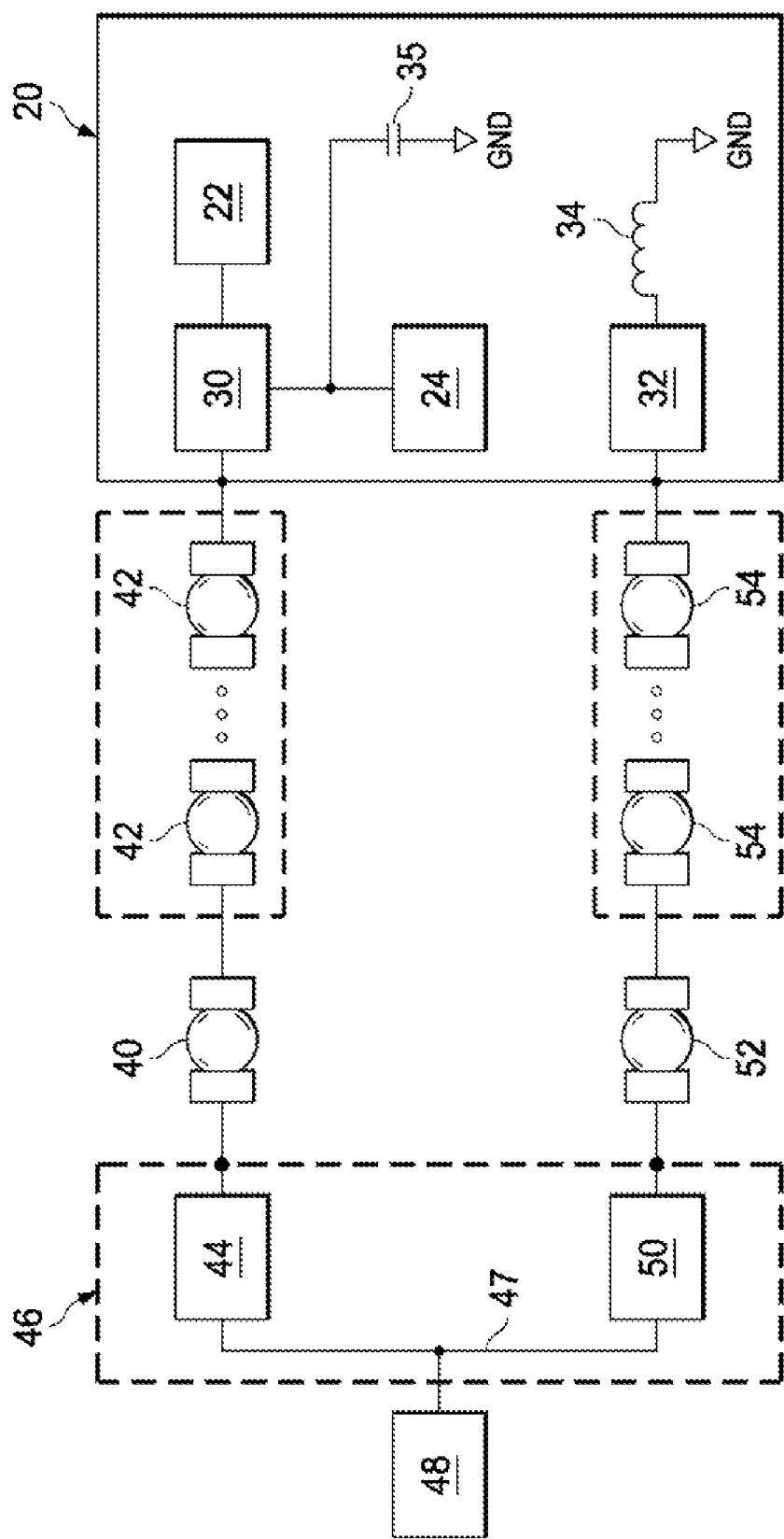
FIG. 1 illustrates a block diagram of a package structure in accordance with an embodiment, wherein the package structure comprises a plurality of micro-bumps for coupling signals.

FIG. 1 illustrates a block diagram of a device in accordance with an embodiment. Die 20 includes integrated circuits therein. In an embodiment, the integrated circuits include main circuit 22 and electro-static discharge (ESD) protection circuit 24. ESD protection circuit 24 and main circuit 22 are coupled to input pad 30, which may be a bond pad, for example. ESD protection circuit 24 protects main circuit 22 from ESD transients that may occur on bond pad 30, and is configured to discharge the ESD transients on bond pad 30 to the electrical ground (marked as GND). A parasitic capacitance of ESD protection circuit 24 is illustrated as capacitor 35, which is coupled to the electrical ground. In an exemplary embodiment, main circuit 22 includes a radio-frequency (RF) device such as a transceiver, which may process RF signals with high frequencies, for example, higher than about 1 GHz, or higher than about 5 GHz.

Bond pad 30 receives signals from (or output signals to) pad 44, which is a part of work piece 46 that is bonded to die 20. Work piece 46 may be a device die with integrated circuits such as transistors therein, an interposer, a package substrate, or the like. Pad 30 is electrically and signally coupled to pad 44 through micro-bump 40, and optionally through one or more micro-bumps 42 coupled in series with micro-bump 40. The number of micro-bumps 42 may range from 1 to 100, for example.

Pad 44 may also be electrically coupled to load device 48, which may be located in another device die or as a discrete device. In an exemplary embodiment, load device 48 is an antenna, which is configured to receive/transmit high-frequency signals such as RF signals that have, for example, frequencies higher than about 1 GHz, 5 GHz, or even higher. The Signals may be transmitted between load device 48 and main circuit 22. Accordingly, there is an electrical path coupling load device 48 and main circuit 22 (please refer to electrical path 51 in FIG. 2).

Work piece 46 may further include pad 50. Pads 44 and 50 may have a direct connection 47 through metal lines and vias. Pad 50 is electrically coupled to pad 32 in die 20. The coupling may be through micro-bump 52, and optionally through one or more micro-bumps 54 coupled in series with micro-bump 52. Pad 32 may be grounded either directly, or through inductor 34. Pad 32 is thus electrically coupled to pad 30 through micro-bumps 52 and 40, and optionally through micro-bumps 42 and/or 54.

In an exemplary embodiment, inductor 34 has an inductance higher than about 1 nH. Inductor 34 may be implemented using coiled wires, for example, and may be implemented in the metal layers (not shown) in die 20. The number of micro-bumps 54 may range from 1 to 100, for example.

Figure 2:
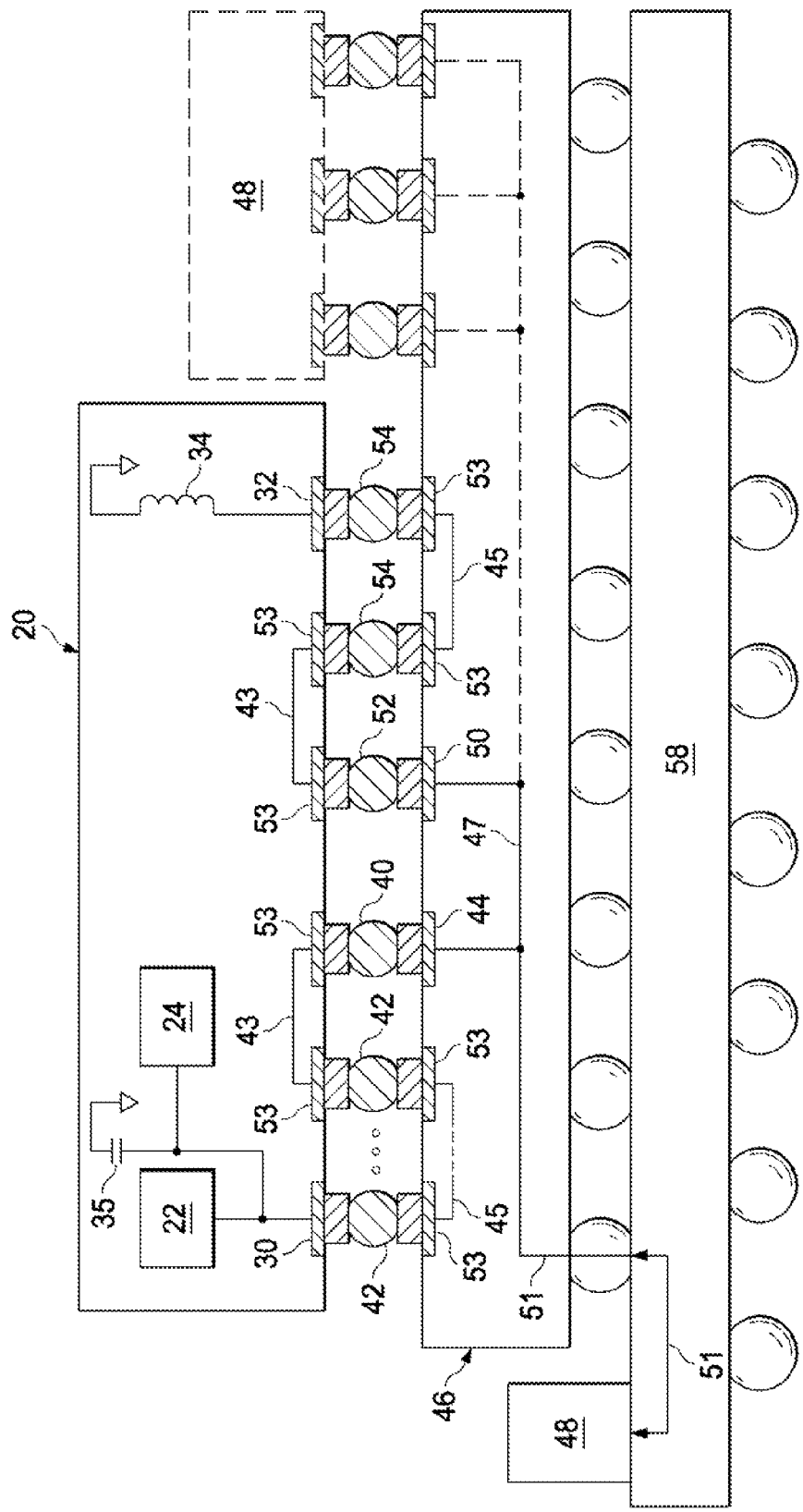
FIG. 2 illustrates an exemplary cross-sectional view of the package structure shown in FIG. 1.

FIG. 2 illustrates a cross-sectional view of a package structure implementing the structure shown in FIG. 1, wherein like elements in FIG. 2 may be found in FIG. 1. In an exemplary embodiment, work piece 46 is an interposer. Micro-bumps 40, 42, 52, and 54 are the bumps for bonding and joining die 20 to work piece 46. Each of micro-bumps 40, 42, 52, and 54 may be bonded through bond pads (such as 30, 32, 44, and 50) formed in die 20 and work piece 46. Work piece 46 may be bonded to package substrate 58, and load device 48 may be an antennal formed on, or bonded onto, package substrate 58. Alternatively, load device 48 may be in a separate die, which may also be bonded to interposer 46, for example, as shown using dashed lines.

The serial connection of micro-bumps 40, 42, 52, and 54 may be implemented by routing the connections back-and-forth between die 20 and work piece 46. Metal connections 43 in die 20 interconnect the bond pad in die 20, and metal connections 45 in work piece 46 interconnect the bond pads in work pieces 46, so that the desirable serial interconnection of bumps 42 and 54 may be achieved. Through such a configuration, many micro-bumps may be connected serially.

At high frequencies, for example, in RF ranges, each of micro-bumps 40, 42, 52, and 54 acts as an inductor with a non-negligible inductance. The electrical performance (such as the S21 parameter between load device 48 and main circuit 22) of the package structure may thus be tuned through adjusting the inductances of micro-bumps 40, 42, 52, and 54. The resulting inductance of the serially coupled micro-bumps 40 and 42 and the resulting inductance of the serially coupled micro-bumps 52 and 54 may be adjusted by adjusting the number of serially connected micro-bumps. The equivalent inductance of micro-bumps 40 and 42 with its corresponding interconnects and the equivalent inductance of micro-bumps 52 and 54 with its corresponding interconnects may counteract the effect of parasitic capacitor 35 of ESD protection circuit 24. The interconnects of micro-bumps 40 and 42 and the interconnects of micro-bumps 52 and 54 may be in any of the metal layers under micro-bumps 40 and 42 such as the bottom metal layer (M1), the second metal layer M2, and the like. Accordingly, high frequency signals may be transferred from load device 48 to main circuit 22 with substantially no degradation in the frequency band that is cared by designers. The equivalent inductors of micro-bumps 40 and 42 and the equivalent inductors of micro-bumps 52 and 54 may thus act as parts of the equivalent filter (not shown) for the high-frequency signals transmitted between load device 48 and main circuit 22, and may help to tune the frequency range of the filtering.

Figure 3:
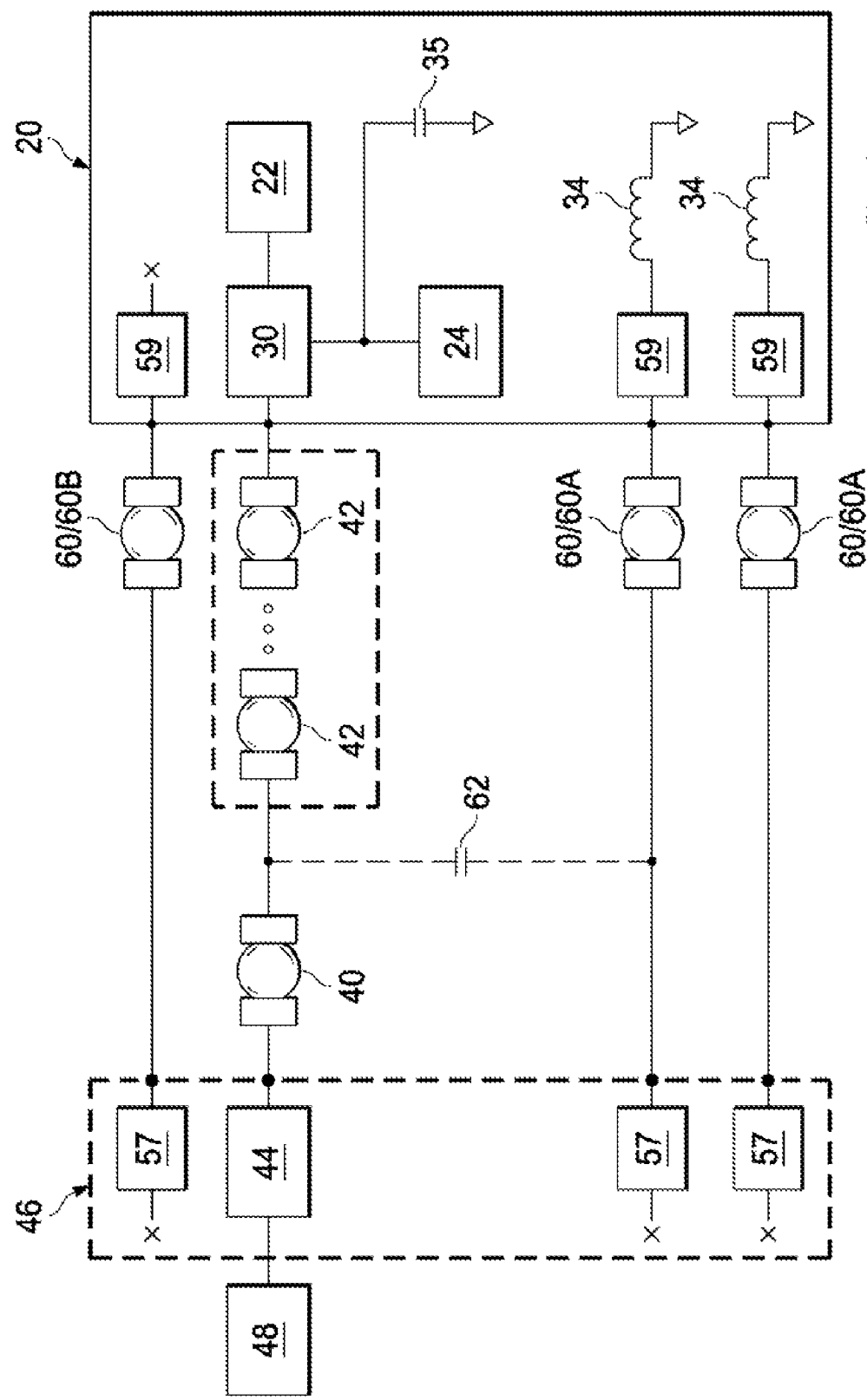
FIG. 3 illustrates a block diagram of a package structure in accordance with various alternative embodiments, wherein the package structure comprises dummy micro-bumps coupled to an electrical ground.
Figure 4:
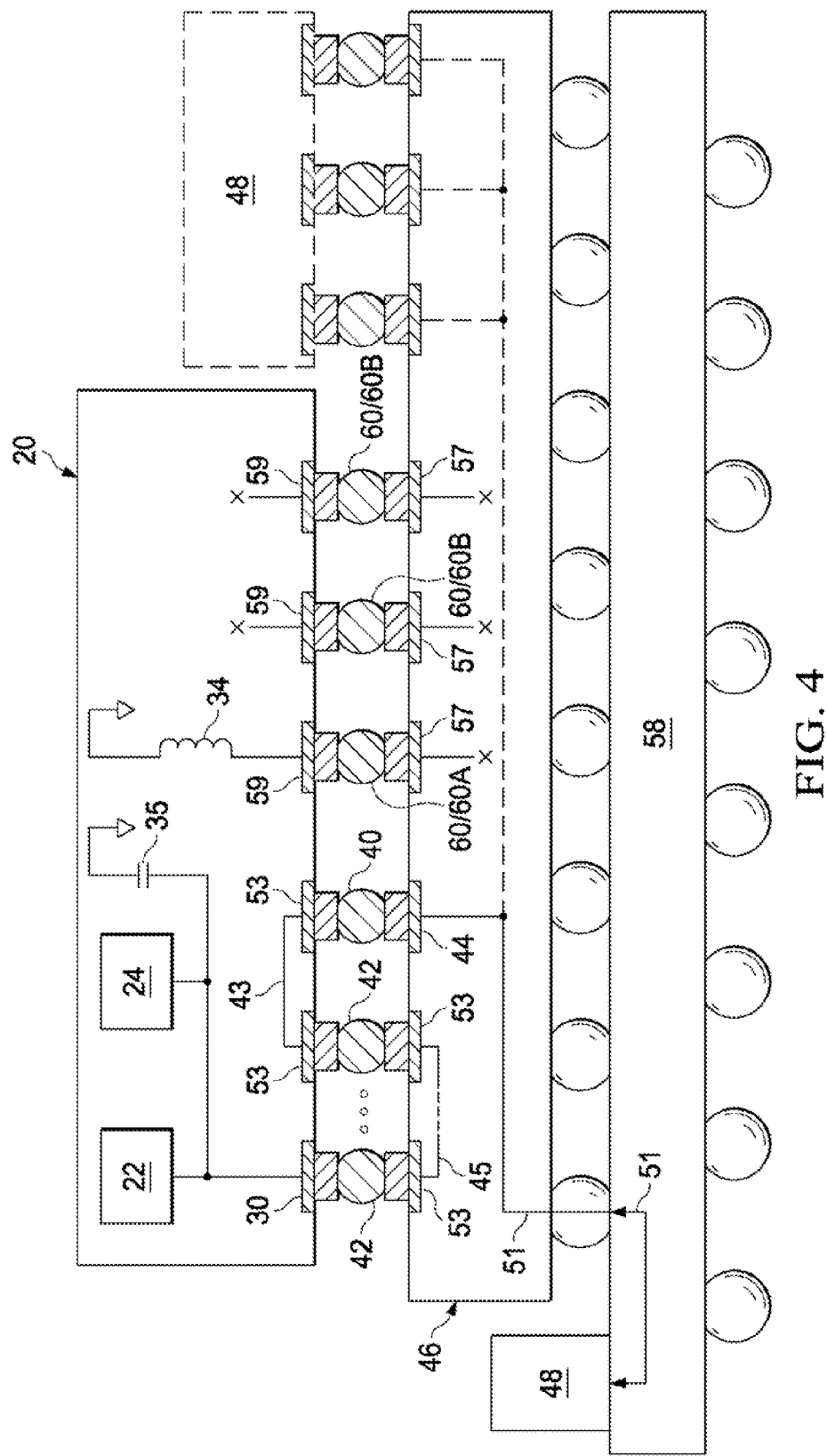
FIG. 4 illustrates an exemplary cross-sectional view of the package structure shown in FIG. 3.
Figure 5:
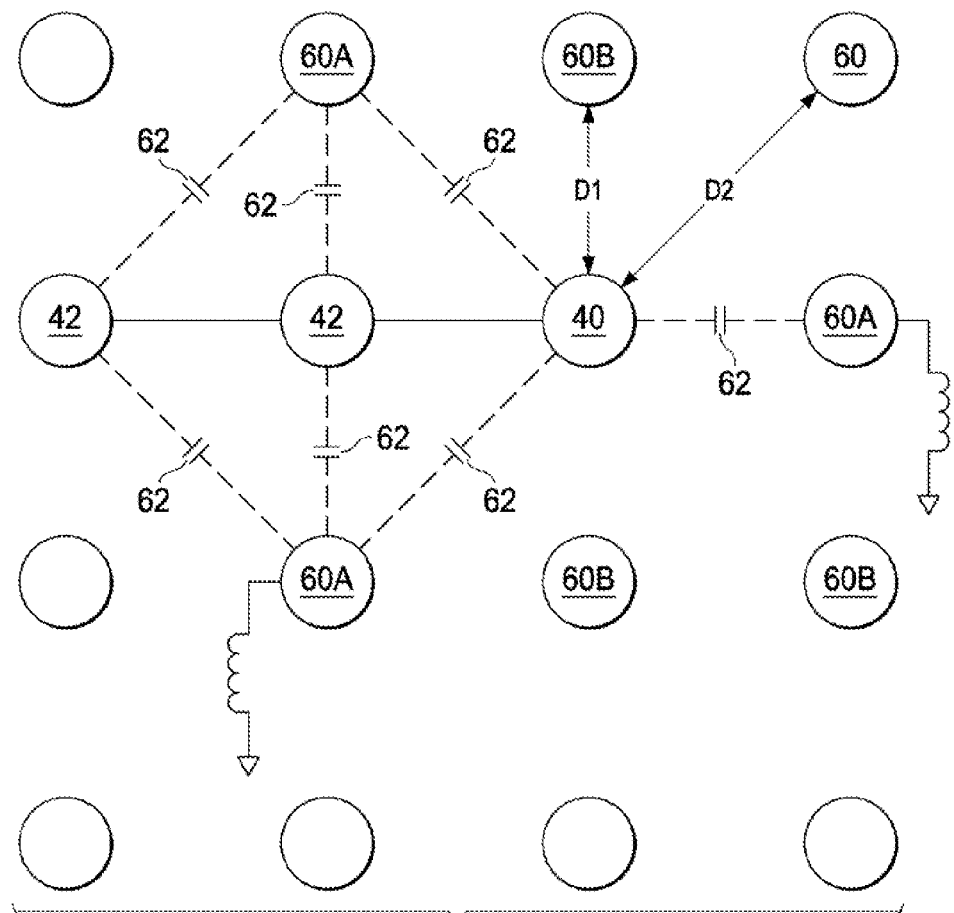
FIG. 5 illustrates an exemplary top view of micro-bumps that are bonded between a die and a work piece as in FIGS. 3 and 4.

FIGS. 3 through 5 illustrate a package structure in accordance with alternative embodiments. Unless specified otherwise, the reference numerals in these embodiments represent like elements in the embodiments illustrated in FIGS. 1 and 2. FIG. 3 illustrates a block diagram. In these embodiments, a plurality of dummy micro-bumps 60 (marked as 60A) is bonded between die 20 and work piece 46, for example, for improve the mechanical properties of the bonding. In the embodiments, the ends of dummy micro-bumps 60 (denoted as 60A) are connected to die 20, and are coupled to the electrical ground through the connections in die 20. The ends of dummy micro-bumps 60A connected to work piece 46, however, remain not connected to the electrical ground and not connected to any other circuits in work piece 46. Alternatively stating, if dummy micro-bumps 60A are to be disconnected from die 20, dummy micro-bumps 60A would have been electrically floating.

In an embodiment, dummy micro-bumps 60A are physically bonded to bond pads 57 of work piece 46. However, there is no further electrical connections from bond pads 57 to the electrical ground and or to other circuits in work pieces 46. The "x" symbol indicates the lack of electrical connection. Between dummy micro-bumps 60A and the electrical ground, additional inductors 34, which may be formed of coiled metals, may also be added optionally. On the side of die 20, dummy micro-bumps 60A may be bonded to bond pads 59, which are further coupled to the electrical ground.

FIG. 4 illustrates a cross-sectional view of a package structure implementing the circuit shown in FIG. 3, wherein like elements in FIG. 4 may be found in FIG. 3. Similarly, work piece 46 may be an interposer. Micro-bumps 40 and 42 and 60 (including 60A and 60B) are the bumps for bonding die 20 to work piece 46. Besides bumps 60A, there may be additional dummy micro-bumps 60B that are also adjacent to micro-bumps 40 and/or 42. Dummy micro-bumps 60B, however, are not grounded, and are electrically floating, which means that dummy micro-bumps 60B are not connected to the electrical ground or the active devices in any of die 20 and work piece 46.

FIG. 5 schematically illustrates a top view of FIG. 4, with micro-bumps 40/42 (representing either micro-bump 40 or 42) and 60 illustrated. It is observed that the illustrated dummy micro-bumps 60 may include first-tier dummy bumps that are immediately neighboring micro-bumps 40/42, with no other dummy bumps between the first-tier dummy micro-bumps 60 and the respective micro-bumps 40/42. The dummy micro-bumps 60 may also include second-tier dummy bumps immediately neighboring first-tier micro-bumps, and spaced apart from micro-bumps 40/42 by first-tier dummy bumps 60. It is observed that the floating dummy micro-bumps 60B do not form parasitic capacitors with micro-bumps 40/42, while each of the grounded dummy micro-bumps 60A forms a parasitic capacitor(s) 62 with micro-bumps 40/42. Accordingly, by adjusting the number of grounded dummy micro-bumps 60A, the total parasitic capacitance between micro-bumps 40/42 and the electrical ground may be adjusted. Further, the adjustment of the total parasitic capacitance may be achieved by adjusting the positions of the grounded dummy micro-bumps 60A. For example, the parasitic capacitances between micro-bumps 40/42 and the second-tier dummy micro-bumps 60 are smaller than the parasitic capacitances between micro-bump 40/42 and the first-tier dummy micro-bumps. Also, the first-tier dummy micro-bumps 60 may also have different distances D1 and D2 from micro-bump 40/42, and hence the respective parasitic capacitances are different. The performance of the resulting package structure and the frequency response may thus be adjusted.

Through the configuration in FIGS. 3 through 5, the equivalent inductance of micro-bumps 40 and 42, the inductance of inductors 34, and the equivalent capacitance between micro-bumps 40/42 and the grounded dummy micro-bumps 60A may be used to adjust the performance of the respective package structure. The high-frequency signals may be transmitted from load device 48 (FIG. 3) to main circuit 22 with desirable filtering behavior, for example, with substantially no degradation for the frequency band cared by the designers. The equivalent capacitors 62 of micro-bumps 40 and 42 and the grounded dummy micro-bumps 60A may thus act as a part of the filter for the signals, and may help to tune the frequency range of the filtering.

Figure 6:
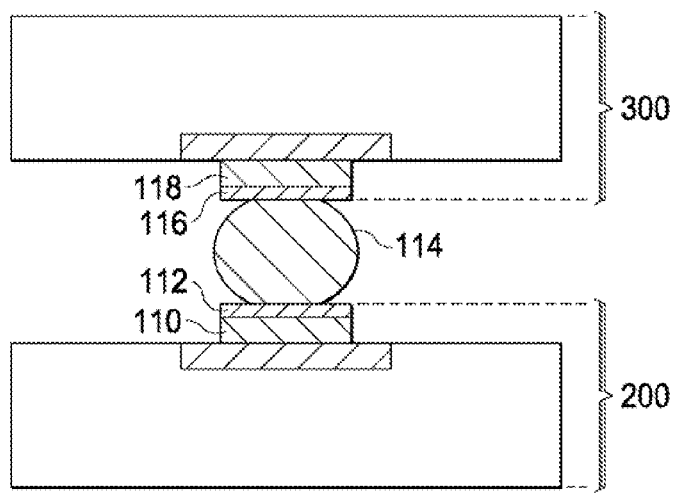
FIGS. 6 and 7 illustrate cross-sectional views of two exemplary micro-bumps.
Figure 7:
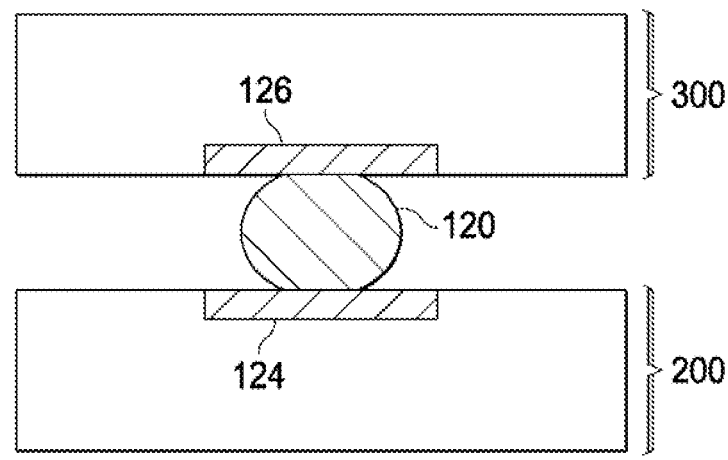

Micro-bumps 40, 42, 52, 54, and 60 as shown in FIGS. 1 through 5 may have various forms and include various components, such as metal bumps that can be reflowed (for example, solder bumps), and metal bumps that cannot be reflowed (such as copper bumps). For example, FIG. 6 illustrates one type of micro-bumps including copper bump 110, nickel layer 112, solder region 114, nickel layer 116, and copper bump 118, wherein copper bump 110 and nickel layer 112 belong to work piece 200, while nickel layer 116 and copper bump 118 belong to work piece 300. Each of work pieces 200 and 300 may be one of die 20 or work piece 46 as shown in FIGS. 1 through 5. Solder region 114 is used to join work piece 200 and 300. FIG. 7 illustrates an alternative micro-bump 120 that is bonded to bond pads 124 and 126, wherein bond pad 124 belongs to work piece 200, while bond pad 126 belongs to work piece 300. Micro-bump 120 may be a solder bump. In yet other embodiments, the micro-bumps of the embodiments may not include solder.

Figure 8:
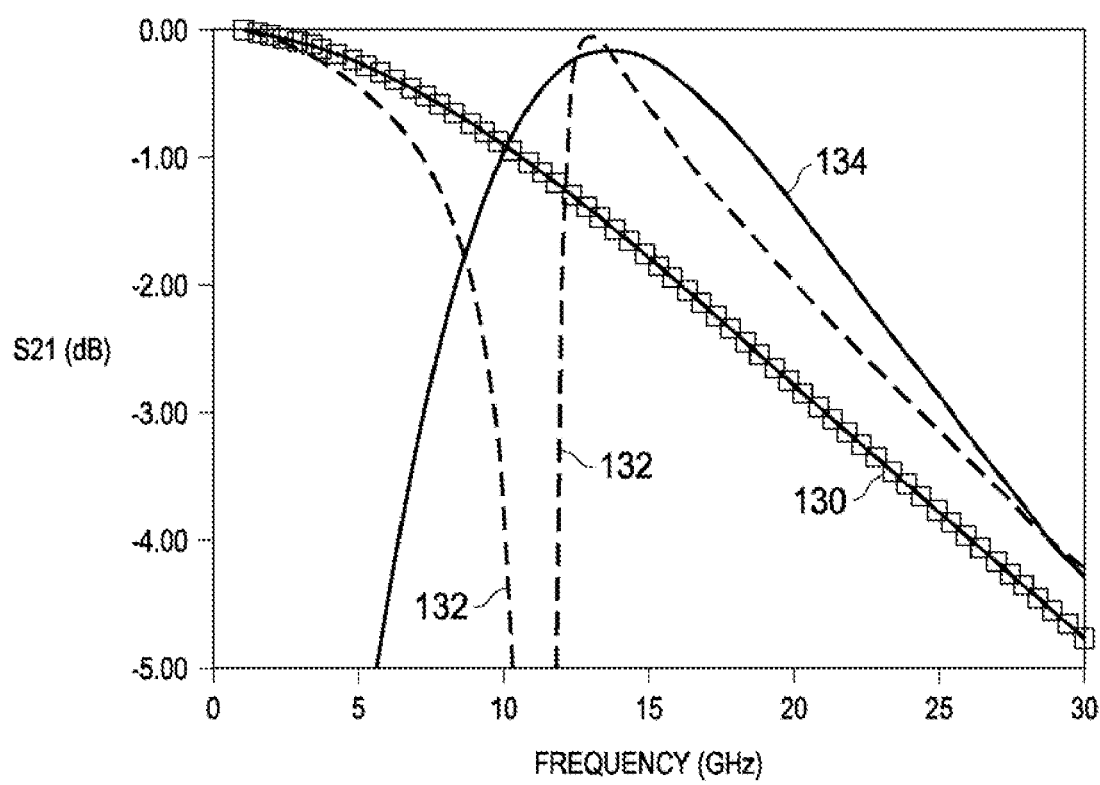
FIG. 8 illustrates simulation results, wherein the results simulated from the embodiments in FIGS. 1 and 2 and the results simulated from the embodiments in FIGS. 3 through 5 are demonstrated.

FIG. 8 illustrates simulation results, wherein S21 parameters (insertion loss) are illustrated as a function of frequencies. Line 130 is the frequency response obtained from the structure similar to the embodiment shown in FIG. 1, except micro-bumps 42, 52, and 54, and inductor 34 are not included. Line 132 is the frequency response obtained from the embodiment shown in FIG. 1. Line 134 is the frequency response obtained from the embodiment shown in FIG. 3. It is observed that at the desirable central frequency of about 15 GHz, the S21 parameter represented by line 130 is degraded by about 2 dB, while the S21 parameters represented by lines 132 and 134 are substantially free from the gain degradation. Furthermore, lines 132 and 134 show a good bandpass behavior.

In accordance with embodiments, a device includes a die including a main circuit and a first pad coupled to the main circuit. A work piece including a second pad is bonded to the die. A first plurality of micro-bumps is electrically coupled in series between the first and the second pads. Each of the plurality of micro-bumps includes a first end joining the die and a second end joining the work piece. A micro-bump is bonded to the die and the work piece. The second pad is electrically coupled to the micro-bump.

In accordance with other embodiments, a device includes a die including a main circuit, a first pad, and a second pad. The first pad is coupled to the main circuit, and the second pad is coupled to an electrical ground. A work piece includes a third pad and a fourth pad, wherein the third and the fourth pads are directly connected to each other. A first micro-bump is bonded between the first and the third pads. A second micro-bump is bonded between the second and the fourth pads.

In accordance with yet other embodiments, a device includes a die including a main circuit, and a first pad coupled to the main circuit. A work piece is bonded to the die and including a second pad. A micro-bump joins the die and the work piece, and is electrically coupled between the first and the second pads. A dummy micro-bump is adjacent to the micro-bump, wherein the dummy micro-bump physically joins the work piece and the die, and is electrically de-coupled from features inside the work piece. The dummy micro-bump is electrically grounded through connections in the die.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
    a die comprising:
        a main circuit; and
        a first pad coupled to the main circuit;
    a work piece comprising a second pad, wherein the work piece is bonded to the die;
    a first plurality of micro-bumps, each comprising a first end joining the die, and a second end joining the work piece, and wherein the first plurality of micro-bumps is electrically coupled in series between the first and the second pads; and
    a micro-bump bonded to the die and the work piece, wherein the second pad is electrically coupled to the micro-bump.

2. The device of claim 1 further comprising a load device electrically coupled to the second pad.

3. The device of claim 2, wherein the load device comprises an antenna.

4. The device of claim 1, wherein the main circuit comprises a radio-frequency (RF) transceiver.

5. The device of claim 1, wherein the die further comprises an electro-static discharge (ESD) protection circuit coupled to the first pad and configured to discharge an ESD transient on the first pad.

6. The device of claim 1 further comprising:
    a third pad in the die; and
    a fourth pad in the work piece, wherein the second pad and the fourth pad are interconnected, and are connected to a same load device, and wherein the micro-bump is coupled between the third and the fourth pads.

7. The device of claim 6 further comprising a second plurality of micro-bumps comprising the micro-bump, wherein each of the second plurality of micro-bumps comprises a first end joining the die, and a second end joining the work piece, and wherein the second plurality of micro-bumps is electrically coupled in series between the third and the fourth pads.

8. The device of claim 6 further comprising an inductor coupled between the third pad and an electrical ground.

9. A device comprising:
    a die comprising a main circuit, a first pad, and a second pad, wherein the first pad is coupled to the main circuit, and the second pad is coupled to an electrical ground;
    a work piece comprising a third pad and a fourth pad, wherein the third and the fourth pads are directly connected to each other;
    a first micro-bump bonded between the first and the third pads; and
    a second micro-bump bonded between the second and the fourth pads.

10. The device of claim 9 further comprising a first plurality of micro-bumps comprising the first micro-bump, wherein each of the first plurality of micro-bumps comprises a first end joining the die, and a second end joining the work piece, and wherein the first plurality of micro-bumps is coupled in series and couples the first pad to the second pad.

11. The device of claim 9 further comprising a second plurality of micro-bumps comprising the second micro-bump, wherein each of the second plurality of micro-bumps comprises a first end joining the die, and a second end joining the work piece, and wherein the second plurality of micro-bumps is coupled in series and couples the third pad to the fourth pad.

12. The device of claim 9 further comprising an inductor coupled between the second pad and the electrical ground.

13. The device of claim 9 further comprising an antenna electrically coupled to the third and the fourth pads.

14. The device of claim 9, wherein the main circuit comprises:
   a radio-frequency (RF) device; and
   an electro-static discharge (ESD) protection circuit coupled to the first pad.

* * * * *